(12) United States Patent
Woldeamanual et al.

(10) Patent No.: US 12,249,115 B2
(45) Date of Patent: Mar. 11, 2025

(54) LARGE SCALE COMPUTATIONAL LITHOGRAPHY USING MACHINE LEARNING MODELS

(71) Applicant: Synopsys, Inc., Mountain View, CA (US)

(72) Inventors: Dereje Shewaseged Woldeamanual, Munich (DE); Thomas Heribert Mülders, Erding (DE); Jiuzhou Tang, Munich (DE); Rainer Zimmermann, Sauerlach (DE); Robert Marshall Lugg, Portland, OR (US); Hans-Jürgen Stock, Dachau (DE); Georg Albert Viehöver, Höhenkirchen-Siegertsbrunn (DE)

(73) Assignee: Synopsys, Inc., Sunnyvale, CA (US)

( * ) Notice: Subject to any disclaimer, the term of this patent is extended or adjusted under 35 U.S.C. 154(b) by 334 days.

(21) Appl. No.: 17/751,549

(22) Filed: May 23, 2022

(65) Prior Publication Data

US 2022/0392191 A1  Dec. 8, 2022

Related U.S. Application Data

(60) Provisional application No. 63/194,801, filed on May 28, 2021.

(51) Int. Cl.
*G06K 9/00* (2022.01)
*G03F 7/00* (2006.01)
*G06N 5/04* (2023.01)
*G06V 10/46* (2022.01)
*G06V 10/75* (2022.01)

(52) U.S. Cl.
CPC ............ *G06V 10/755* (2022.01); *G03F 7/705* (2013.01); *G06N 5/04* (2013.01); *G06V 10/469* (2022.01)

(58) Field of Classification Search
CPC .... G06F 30/398; G06F 2119/18; G06F 30/20; G06F 30/39; G06F 17/10; G06F 2111/04; G06F 2111/06; G06F 2111/08; G06F 30/00; G06F 30/333; G06T 2207/30148; G06T 2207/10061; G06T 2207/20081;
(Continued)

(56) References Cited

U.S. PATENT DOCUMENTS

2016/0078166 A1* 3/2016 Ünal ........................ G03F 1/78
716/51
2020/0151538 A1* 5/2020 Sha ....................... G06V 10/774

OTHER PUBLICATIONS

Watanabe et al., "Accurate lithography simulation model based on convolutional neural networks", Proc. SPIE 10147, Optical Microlithography XXX, 101470K (Mar. 30, 2017) (Year: 2017).*
(Continued)

*Primary Examiner* — Alex Kok S Liew
(74) *Attorney, Agent, or Firm* — Fenwick & West LLP

(57) ABSTRACT

A computational lithography process uses machine learning models. An aerial image produced by a lithographic mask is first calculated using a two-dimensional model of the lithographic mask. This first aerial image is applied to a first machine learning model, which infers a second aerial image. The first machine learning model was trained using a training set that includes aerial images calculated using a more accurate three-dimensional model of lithographic masks. The two-dimensional model is faster to compute than the three-dimensional model but it is less accurate. The first machine learning model mitigates this inaccuracy.

20 Claims, 7 Drawing Sheets

(58) Field of Classification Search
CPC ......... G06T 2207/20084; G06T 7/0004; G06T 7/0006; G06T 7/11; G06T 7/64
See application file for complete search history.

(56) References Cited

OTHER PUBLICATIONS

Ronneberger, O. et al. "U-Net: Convolutional Networks for Biomedical Image Segmentation." Medical Image Computing and Computer-Assisted Intervention—MICCAI 2015, LNCS vol. 9351, Oct. 2015, pp. 234-241.

Zhang, R. "Making Convolutional Networks Shift-Invariant Again." Proceedings of the 36$^{th}$ International Conference on Machine Learning, vol. 97, Jun. 9-15, 2019, pp. 7324-7334.

* cited by examiner

LARGE SCALE COMPUTATIONAL LITHOGRAPHY USING MACHINE LEARNING MODELS

RELATED APPLICATION

This application claims priority under 35 U.S.C. § 119(e) to U.S. Provisional Patent Application Ser. No. 63/194,801, "Large Scale Computational Lithography Using Machine Learning Models," filed May 28, 2021. The subject matter of all of the foregoing is incorporated herein by reference in its entirety.

TECHNICAL FIELD

The present disclosure generally relates to computational lithography. In particular, the present disclosure relates to computational lithography using machine learning models.

BACKGROUND

One step in the manufacture of semiconductor wafers involves lithography. In a typical lithography process, a source produces light that is collected and directed by collection/illumination optics to illuminate a lithographic mask. Projection optics relay the pattern produced by the illuminated mask onto a wafer. The resulting light distribution, referred to as the aerial image, exposes resist on the wafer according to the illumination pattern of the aerial image. The patterned resist is then developed, and the resulting resist structure is used in a process to fabricate structures on the wafer.

Because lithographic masks are complex and expensive to manufacture, simulation is used to design lithographic masks and to design the overall lithography process. These computer simulations are referred to as computational lithography. A typical computational lithography flow is based on physical models. It may involve rigorously solving Maxwell's equations in three dimensions, solving differential equations that govern reaction-diffusion processes and solving other mathematical models of the underlying physical processes. The end result may be a prediction of the three-dimensional (3D) resist profile. However, this conventional computational lithography flow can be computationally expensive to implement.

SUMMARY

In some aspects, a computational lithography process uses machine learning models in place of the more computationally expensive physical models. An aerial image produced by a lithographic mask is first calculated using a two-dimensional model of the lithographic mask. This first aerial image is applied to a first machine learning model, which infers a second aerial image. The first machine learning model was trained using a training set that includes aerial images calculated using a more accurate three-dimensional model of lithographic masks. The two-dimensional model is faster to compute than the three-dimensional model but it is less accurate. The first machine learning model mitigates this inaccuracy.

In other aspects, an exposure model is applied to the second aerial image to generate an acid latent image. This is then applied to a second machine learning model, which infers a resist profile from the acid latent image. The exposure model is a simplified model that is fast to compute but less accurate than desired, and the second machine learning model mitigates this inaccuracy.

Other aspects include components, devices, systems, improvements, methods, processes, applications, computer readable mediums, and other technologies related to any of the above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
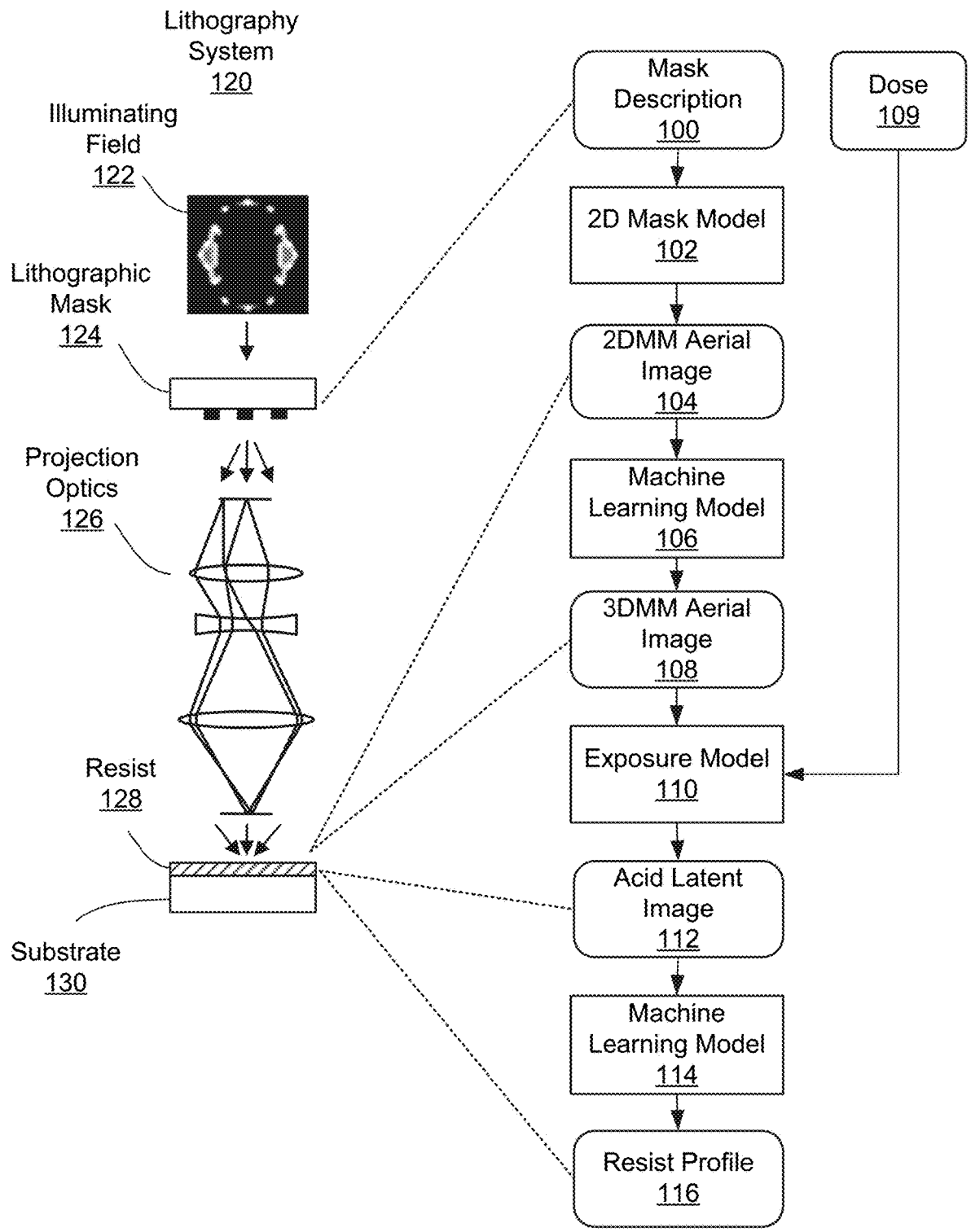
FIG. 1 is a flow diagram of a computational lithography flow in accordance with embodiments of the present disclosure.

Aspects of the present disclosure relate to large scale computational lithography using machine learning models. Rather than executing computationally expensive simulations based on mathematical models of the underlying physical processes, machine learning models are trained to infer the desired results and then the machine learning models are used in the computational lithography flow to augment faster but less accurate simulation models. This speeds up the overall simulation while maintaining sufficient accuracy.

A conventional computational lithography flow starts by simulating the aerial image resulting from a topographical (three dimensional) description of the lithographic mask. This uses the computationally expensive process of solving Maxwell's equations in three dimensions to compute the electric field behind the lithographic mask, given the electric field incident on the lithographic mask. From this, the intensity distribution inside the photoresist layer is calculated. This is then used to compute the acid latent image, which accounts for the exposure dose. In the next step, the reaction-diffusion processes during the post exposure-bake and possible mechanical deformation processes are computed. This is another computationally expensive process. The resulting information is used to obtain a development rate for simulating the lithographic pattern formation inside the photoresist. Simulation of the development process is also computationally expensive.

The overall flow based on physical models may be mathematically accurate but it is computationally expensive. This limits its application. For example, it can be too expensive to practically run these simulations on mask areas larger than approximately 10 um×10 um. It can also be too slow to run these simulations many times as the design of the lithographic mask is iterated. Computationally expensive flows also require more compute resources, including more memory, more processing power and more communications bandwidth. This also increases costs.

In one aspect, computationally expensive models are replaced by trained machine learning models which run faster. For example, rather than using a three-dimensional model of the lithographic mask and then rigorously solving Maxwell's equations in three dimensions to predict the aerial image produced by the mask, a faster two-dimensional model may be used coupled with a machine learning model trained to infer the difference between the two-dimensional and three-dimensional mask models. The two-dimensional mask model is faster to simulate, and accuracy loss is reduced by the machine learning model. The machine learning model may be trained using supervised learning, where the training set includes aerial images calculated using the two-dimensional model and corresponding aerial images calculated using the three-dimensional model.

A similar approach may be used to simulate the resist profile that results from a given acid latent image. Rather than using computationally expensive models based on the reaction-diffusion processes during the post exposure-bake, possible mechanical deformation, and resist development processes, a machine learning model is used. A simple exposure model may be used to calculate the acid latent image from the aerial image, and then the machine learning model infers the resist profile from the acid latent image. The machine learning model may also be trained using supervised learning, based on training samples calculated using the more complex models.

The use of machine learning models in this way can result in a faster runtime for the computational lithography simulation while maintaining sufficient accuracy. This can speed up design time and reduce costs. This can enable the use of computational lithography in situations where it was previously infeasible, for example in cases where the mask area was too large or too many simulations were required. The use of machine learning models can also reduce the compute resources required: less memory, less processing power and less communications bandwidth.

FIG. 1 is a flow diagram of a computational lithography flow in accordance with embodiments of the present disclosure. The left side of FIG. 1 shows a lithography system 120 and the right side of FIG. 1 shows a computational lithography flow for simulating that system. In a lithography system 120, a light source (not shown) produces a light distribution (the illuminating field 122) that is incident on a lithographic mask 124 that has a certain mask topology. Light from the illuminating field 122 propagates through the lithographic mask 124, resulting in a light distribution referred to as the near field. That light is imaged by projection optics 126 onto resist 128 on a substrate 130 (e.g., a semiconductor wafer). The light distribution illuminating the resist 128 is referred to as the aerial image. The aerial image exposes a resist process (e.g., including exposure, post-exposure bake (PEB), and development) that results in a three-dimensional shape (profile) in the resist 128.

The right side of FIG. 1 shows a computational lithography flow that predicts the resist profile 116 from a lithographic mask description 100. A two-dimensional (2D) mask model 102 uses the lithographic mask description 100 of the lithographic mask as input and predicts the resulting aerial image 104, which will be referred to as the two-dimensional mask model (2DMM) aerial image because it is based on a two-dimensional model for the lithographic mask 124. The model(s) producing the 2DMM aerial image may include models for the illumination of the mask, a thin mask model and an imaging model for projection of the light field from the mask to the resist location.

A thin mask model 102 models the lithographic mask as a thin sheet, where each point on the sheet affects the phase and amplitude of the incident illumination, but other effects caused by thickness of the mask are neglected. As a result, the thin mask model may be calculated relatively quickly. This is in contrast to a full three-dimensional mask model, in which the three-dimensional topography effects in a mask diffraction process are also considered, for example in order to predict behaviors such as critical dimension (CD), pattern shift, Bossung tilt and best focus shift. In a rigorous three-dimensional mask model, the mask diffraction process is governed by Maxwell's equations, typically solved in three dimensions using a rigorous electromagnetic field (EMF) solver applied to a three-dimensional description of the lithographic mask.

Effects of the projection optics 126 may be modeled using an Abbe imaging model or a Hopkins imaging model. For full-chip optical proximity correction (OPC) or inverse lithography technology (ILT) applications, the Hopkins imaging model in conjunction with singular value decomposition (SVD) may be used for its computational efficiency.

The two-dimensional mask model 102 is faster to compute than a three-dimensional mask model, but it largely neglects effects resulting from the three-dimensional topography of the mask. These effects are accounted for by a first machine learning model 106, as described in more detail below. The 2DMM aerial image 104 is applied to the first machine learning model 106, which infers an aerial image 108 that mitigates the inaccuracy resulting from neglecting the three-dimensional mask effects.

For example, the aerial images 104, 108 may be represented by two-dimensional slices of the aerial image at different z-heights. The first machine learning model 106 may account for the interaction between different slices, which may be neglected by the two-dimensional mask model. For convenience, aerial image 108 will be referred to as the three-dimensional mask model (3DMM) aerial image because it accounts for the three-dimensional mask effects even though it is not directly produced by applying a three-dimensional mask model such as Maxwell's equations. The 3DMM aerial image 108 accounts for three-dimensional topography of the lithographic mask, but using the first machine learning model 106 avoids the computational cost required by a full three-dimensional simulation based on Maxwell's equations.

In FIG. 1, the aerial images 104, 108 are normalized with respect to exposure dose. Exposure dose is a measure of the amount of energy used to expose the resist. Because they are normalized, the aerial images 104, 108 are independent of dose and do not need to be recalculated as the dose changes. The actual dose 109 is applied to the 3DMM aerial image 108 using an exposure model 110. This results in the acid latent image 112. A second machine learning model 114 then infers the three-dimensional resist profile 116 corresponding to the acid latent image 112. In a more rigorous conventional approach, the reaction-diffusion processes during the post exposure-bake and possible mechanical deformation processes are computed. The resulting information is used to obtain a development rate for simulating the lithographic pattern formation inside the photoresist. The development process is modeled, including resist shrinkage effects. In some cases, these more complex models may solve partial differential equations to describe these resist processes. Here, the second machine learning model 114 replaces these more computationally expensive models.

One advantage of the computational lithography flow described in FIG. 1 is that three-dimensional information and effects for the mask, the intensity distribution, and the concentrations of relevant chemical species in the resist are accounted for by the first and second machine learning models 106, 114 and result in a three-dimensional resist profile 116. This can lead to more accurate predictions, because the properties (intensity, concentrations, etc.) of either the mask, the intensity distribution or the resist at one z-height can have an impact on the properties at another z-height.

In some implementations, all of the simulation results 104, 108, 112 and 116 are three-dimensional. The aerial images 104, 108 are intensity distributions throughout a volume, the acid latent image is also described throughout a volume, and the resist profile is a description of the three-dimensional shape of the resist. These three-dimensional quantities may be represented as a set of two-dimensional slices at different heights. In some cases, all four of these quantities have the same number of slices at the same z-heights.

Another feature of the computational lithography flow described in FIG. 1 is that it can be applied for different exposure doses 109, without having to switch or retrain the first and second machine learning models 106, 114. The same machine learning models may be used for different dose conditions, for example by normalizing them relative to dose or by training them for different dose conditions. In addition, the first and second machine learning models 106, 114 preferably do not use dose as an input, so that dose is used only by the exposure model 110.

Figure 2A:
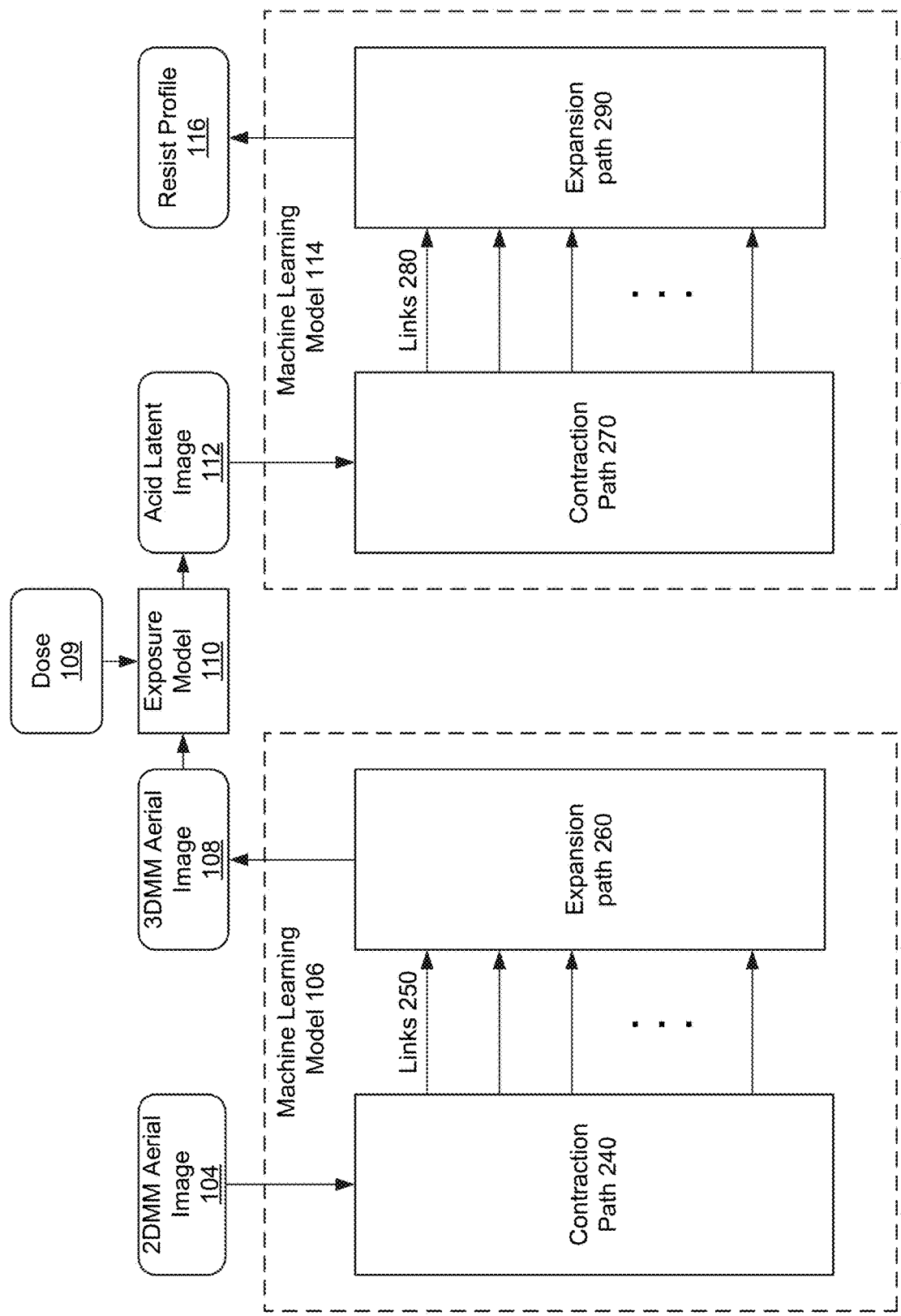
FIGS. 2A and 2B illustrate an example architecture of machine learning models in accordance with embodiments of the present disclosure.
Figure 2B:
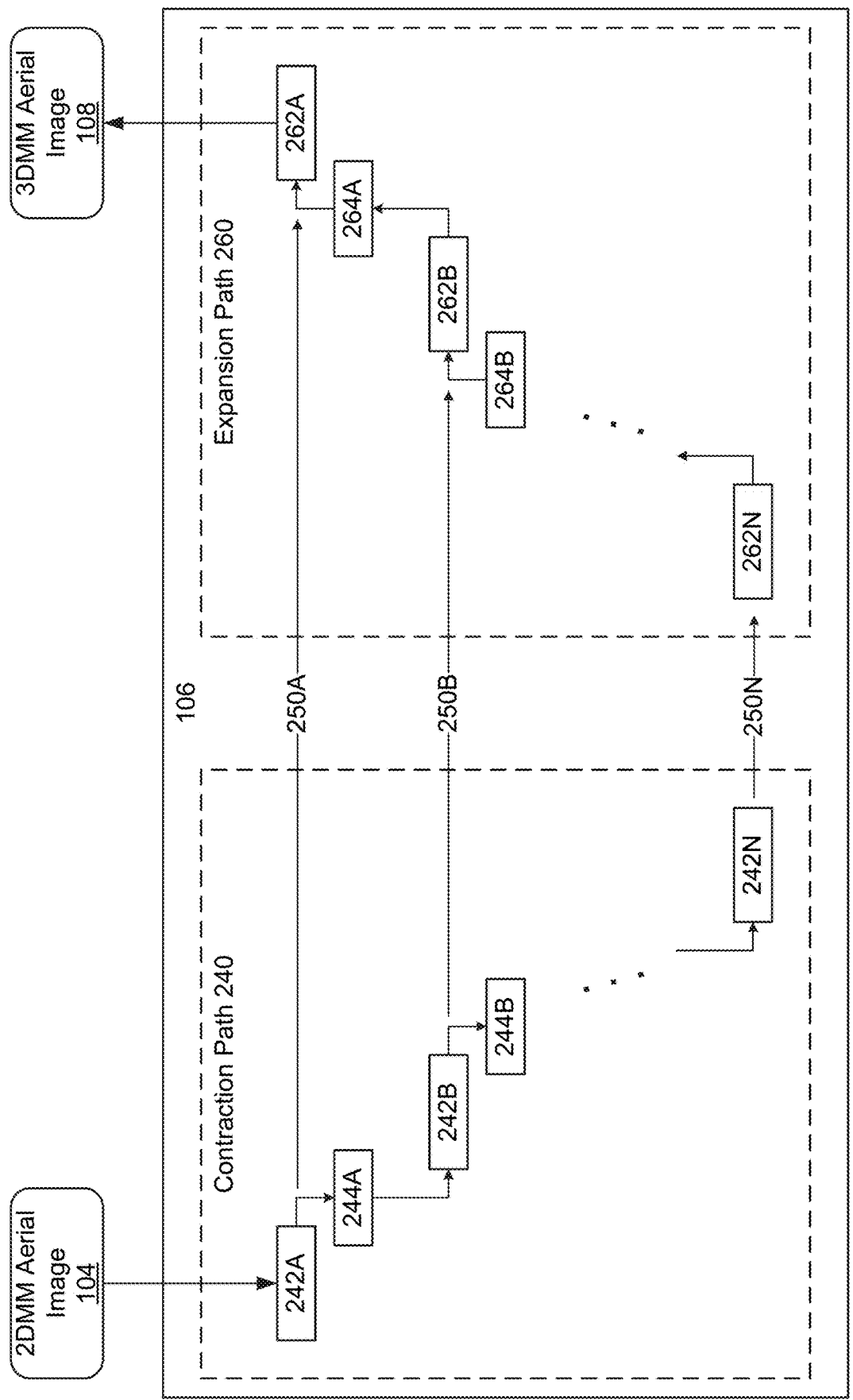

FIGS. 2A and 2B illustrates an example architecture of the first and second machine learning models 106, 114. As shown in FIG. 2A, the two machine learning models 106, 114 form a double U-net structure. The first machine learning model 106 is one U-net, and the second machine learning model 114 is the other U-net. These two U-net structures are arranged in a way that the output from the first machine learning model 106 produces the input to the second machine learning model 114 via the exposure model 110.

FIG. 2B is a diagram of the first U-net machine learning model 106. The U-net structure includes a contraction path 240 and an expansion path 260. The contraction path 240 includes a series of convolution stages 242 linked together by downsampling stages 244. The convolution stages 242 perform convolutions and may also apply non-linear functions. If the input to a convolution stage 242 has dimension M×M×J where the image size is M×M with J channels, then the output of the stage typically has dimension N×N×K where N≈M and K>J. Within a convolution stage 242, the image size stays approximately the same but the number of channels increases as more features are developed. The downsampling stages 244 reduce the resolution of the image size. For example, if the input to a downsampling stage 244 has size M×M×J, then the output may have size (M/2)×(M/2)×J. Different downsampling techniques may be used. One example is blurring followed by max pooling. This has advantages in improving the model with respect to shifts in the inputs. Physically, a shift in the input will result in a corresponding shift of the output, so the machine learning model should also exhibit that behavior. Blur-pooling has that behavior, whereas other types of downsampling do not.

The expansion path 260 reverses the dimension changes of the contraction path 240. The convolution stages 242 have counterpart stages 262, which may be implemented in different ways. For example, the stages 262 may include two operations: a convolution and a concatenation of the output of the convolution and the skip connections 250. As another example, the stages 262 may be a transposed convolution. The downsampling stages 244 have counterpart upsampling stages 264.

Since the output of a U-net model is not just a class or a label, but an image, in most cases with similar dimension as the input, upsampling in the expansion path 260 is used to recover the resolution and information from the feature maps. Different methods may be used: interpolations such as bi-linear, bi-cubic, and nearest neighbor, un-pooling, and transposed convolution. This specific examples uses bi-linear interpolation.

Skip connections 250 transfer data from the contraction path 240 to the expansion path 260. In this way, the features developed at each stage 242 of the contraction path 240 may be collected along the expansion path 260.

In some implementations, the input to the first U-net 106 is the 2DMM aerial image 104 represented as an M×M×J array, where the j index represents M×M slices of the aerial image at different z-heights. The output of the first U-net 106 is the 3DMM aerial image 108 which also has size M×M×J. Both aerial images 104, 108 are sampled at the same (x,y,z) spatial locations.

In FIG. 2A, the exposure model 110 is given by a single equation:

$$\text{Acid latent image}=1-\exp(-C*D*(3\text{DMM aerial image})) \quad (1)$$

where C is a parameter and D is the exposure dose 109. The 2DMM aerial image 104 and 3DMM aerial image 108 are normalized relative to dose, and the exposure dose 109 is then accounted for by Eqn. 1. As a result, the first machine learning model 106 can be used for different dose values. Since Eqn. 1 defines a one-to-one mapping of 3DMM aerial image to acid latent image, each of the M×M×J samples of the 3DMM aerial image 108 is transformed to a corresponding sample of the acid latent image 112. The resulting acid latent image 112 also has size M×M×J sampled at the same (x,y,z) spatial locations.

The second U-net machine learning model 114 has a similar structure to the first U-net 106, with a corresponding contraction path 270, expansion path 290 and cross-links 280. The input is the M×M×J acid latent image 112 and the output is the resist profile 116. The resist profile 116 may also be represented by an M×M×J array. Each of the J slices defines the contours (edges) of the resist at that z-height. The contours may be represented by a signed distance value function. The value of the function at each (x,y) sample point has a magnitude and a sign. The magnitude is the distance from the sample point to the closest resist contour and the sign indicates whether the sample point lies inside or outside the closest resist contour (i.e., within the three-dimensional resist structure or outside the resist structure).

In the example of FIG. 2, the first and second machine learning models 106, 114 are supervised deep learning models. Training of supervised deep learning models uses training sets of known input-output pairs. The output of each pair may be referred to as the ground truth or the target. The two machine learning models 106, 114 may be trained separately.

Figure 3A:
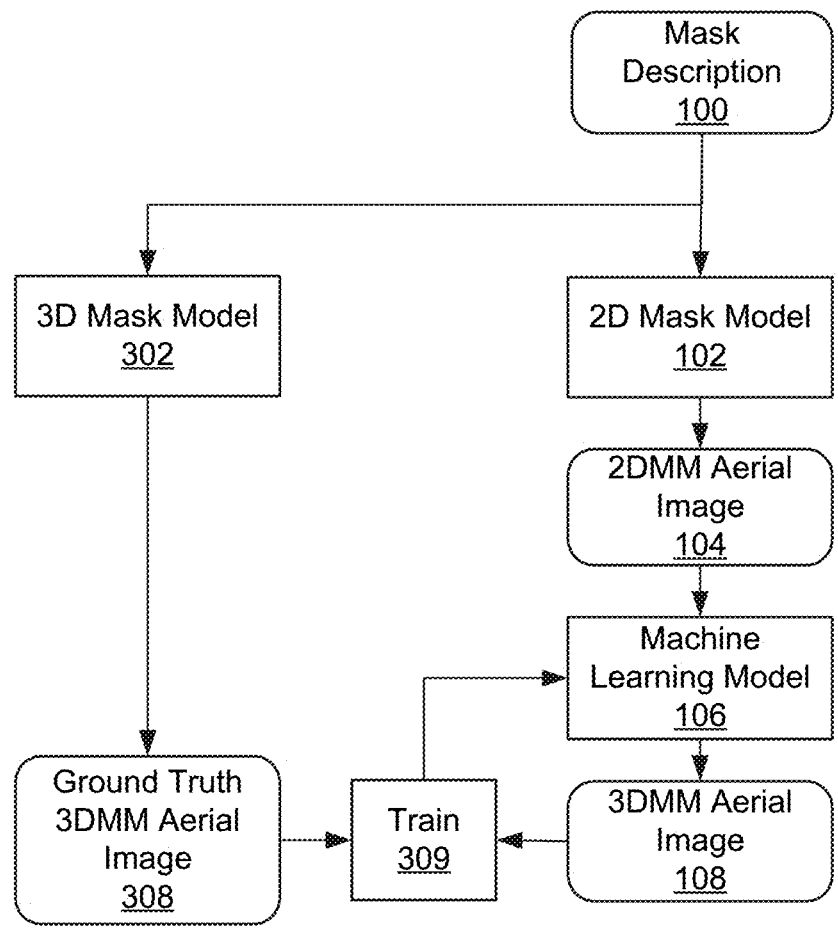
FIGS. 3A and 3B are flow diagrams of training of machine learning models in accordance with embodiments of the present disclosure.
Figure 3B:
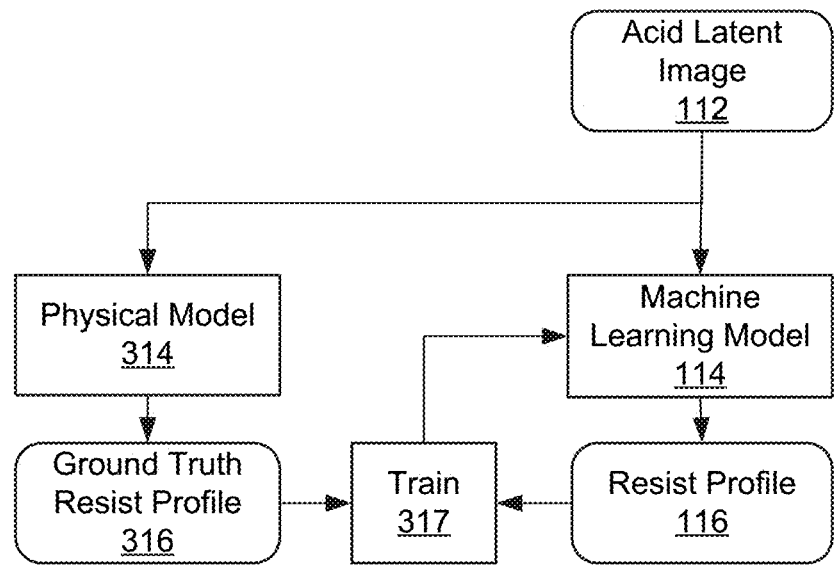

FIGS. 3A and 3B are flow diagrams of the training of the first and second machine learning models 106, 114 in accordance with embodiments of the present disclosure. These figures show both the generation of training sets, and the training of the first and second machine learning models 106, 114. This is done for convenience. It does not mean that these steps must occur concurrently. For example, the training sets may be generated separately and then used to train the machine learning models at a later time.

As shown in FIG. 3A, the first machine learning model 106 receives a 2DMM aerial image 104 as input. This is calculated by applying a two-dimensional mask model 102 to a design of a lithographic mask 100. The output of the first machine learning model 106 is the 3DMM aerial image 108. For the training set, the ground truth 3DMM aerial image 308 is calculated using a three-dimensional mask model 302. This may be a physical simulation model such as rigorous solution of Maxwell's equations. The training set for the first machine learning model 106 then includes input/output pairs of (a) the 2DMM aerial images 104 calculated using the two-dimensional model of the lithographic masks, and (b) the corresponding ground truth 3DMM aerial images 308 calculated using the three-dimensional model 302 of the lithographic masks. For convenience, the aerial images 104, 308 in the training set may be referred to as training aerial images. The output 3DMM aerial images 108 inferred by the first machine learning model 106 are compared to the ground truth aerial images 308 in the training set, and the first machine learning model 106 is trained 309 based on that comparison.

The 2DMM aerial image provides advantages because it is continuous and band limited in the frequency domain, so there can be no information losses when represented on a pixel grid. The 2DMM aerial image also includes information about defocus and other aberrations. As a result, the first machine learning model 106 can be trained to account for these, rather than requiring different machine learning models for different amounts of defocus or aberration.

FIG. 3B shows a similar approach for the second machine learning model 114. This second machine learning model 114 receives an acid latent image 112 as input. The acid latent image 112 may be generated from an aerial image, for example by applying Eqn. 1. The output of the second machine learning model 114 is the resist profile 116, for example expressed as a signed distance value. Signed distance value has advantages over a description based on expressly tracing the contours. It allows a smoother cost function compared to a binary cost function and it is easier to give weightings based on the contours, as described in FIG. 4. For the training set, the ground truth resist profile 316 is determined using physical models 314 of the resist exposure and development. The training set for the second machine learning model 114 includes input/output pairs of (a) the acid latent image 112, and (b) the corresponding ground truth resist profiles 316. The resist contours 116 inferred by the second machine learning model 114 are compared to the ground truth resist contours 316 in the training set, and the second machine learning model 114 is trained 317 based on that comparison.

The exposure model 110 may also be included for training purposes. In that case, the 3DMM aerial image may be used as the input. The parameters for the exposure model, such as C in Eqn. 1 may be adapted in conjunction with training the second machine learning model 114.

In some embodiments, the first and second machine learning models 106, 114 use multiple slices (e.g., 3-7 slices) at different z-heights. This captures three-dimensional information about the resist profile 116, such as the side wall angle of the resist profile. It also increases the accuracy of the inference models. As an example, for the case of three z-heights, the first machine learning model 106 of the overall flow considers three slices of 2DMM aerial images as input and three slices of 3DMM aerial images as output. Then the second stage 110-114 uses the three 3DMM aerial images outputted from the first machine learning model 106 as input and the three slices of resist contours 116 as a target. This improves the accuracy of the overall model compared to using only one slice for training because interactions between the slices may be more directly accounted for.

The training step 309, 317 for both machine learning models uses a cost function. The cost function may be weighted according to the ground truth outputs in the training set. For the first U-net 106, the ground truth aerial image 308 may be used as the weight. This will give more weight to areas of higher light intensity.

For the second U-net 114, the weight W may be given by $$W = \exp(-\alpha \cdot SD^2) \quad (2)$$

where SD=signed distance value, and α=constant. This gives more weight to points closer to the contours. The constant value a in Eqn. 2 determines the width of the area around the contour where the weights are larger. Larger values of a mean that the weight W drops off more quickly.

Figure 4:
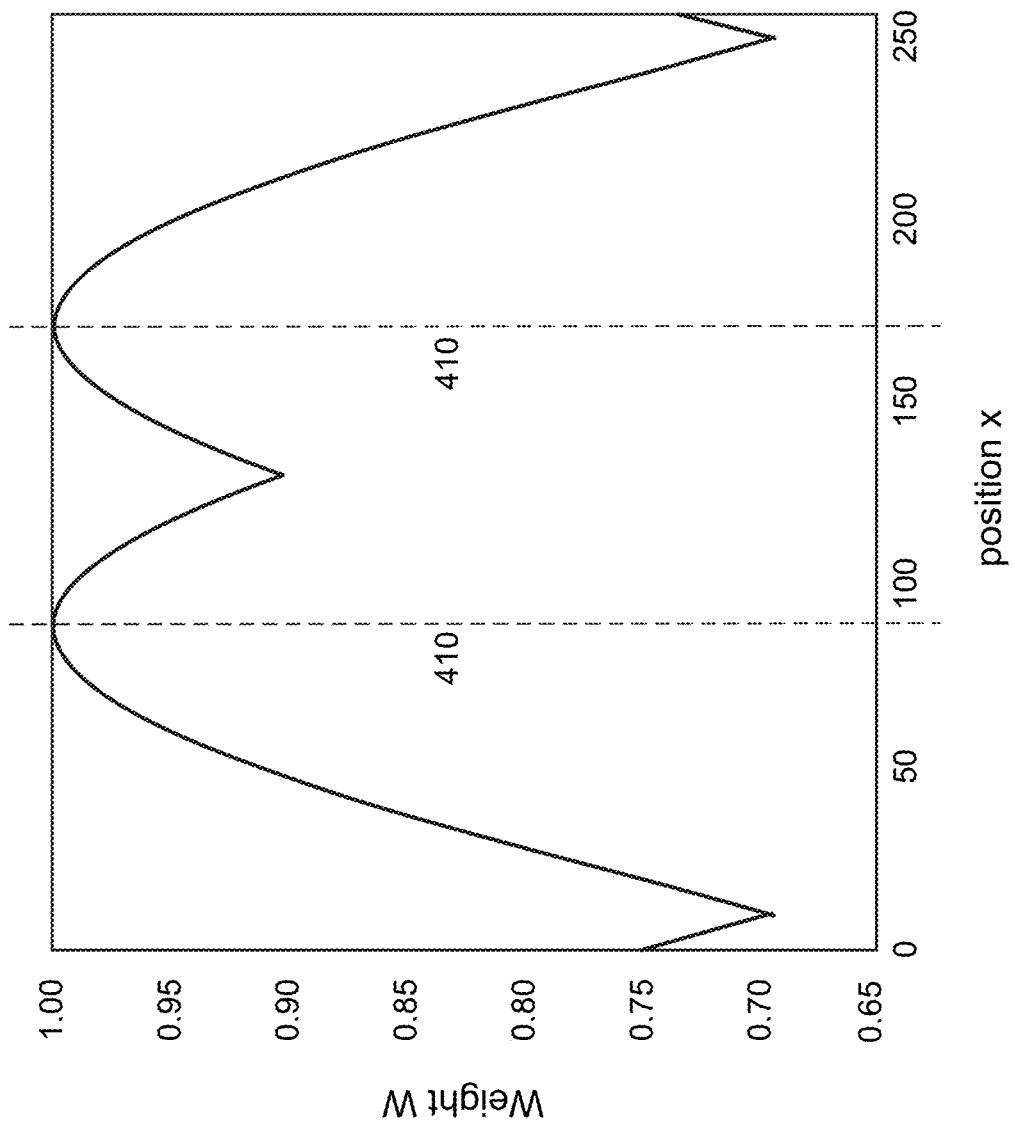
FIG. 4 is a graph of weighting of a cost function in accordance with embodiments of the present disclosure.

An example of this weighting relation is shown in FIG. 4. The x-axis is position and the y-axis is the weight value W at that position. In this example, the contours are located at the positions marked by the dashed lines 410. For example, this resist feature may be a line with edges at the two locations 410. The weight W has a maximum value of 1 at these locations, since the signed distance value is 0. The weight W falls as the position moves away from the contour locations 410.

During training, the overall model utilizes the 2DMM and 3DMM aerial images and the signed distance functions because it is separately training two machine learning models. The 2DMM and 3DMM aerial images are input/output pairs for one machine learning model, and the 3DMM aerial images and signed distance functions for the resist contours are input/output pairs for the other machine learning model. During inference, the overall flow may predict the signed distance function by taking only the 2DMM aerial image as input. The 2DMM aerial image is sufficient because the three-dimensional effects are learned and covered by the deep learning models. Since the computation of the 2DMM aerial image is faster, the overall run time is reduced. In addition to the 2DMM aerial image, the overall model also takes the dose values as an input, which is then used inside the model to create the latent image without adding additional computational load.

The approach described above has been tested with different datasets from different sources. The results show the advantage the model brings to simulating large areas. Table 1 below shows the runtime comparison between a rigorous three-dimensional model (e.g., based on the S-Litho HPL model) and the present deep learning model shown in FIG. 2.

TABLE 1

Runtime comparison between a rigorous three-
dimensional model and the deep learning model
for a 300 um × 300 um area using 800 cores

|  | Rigorous three-dimensional model | Present deep learning model |
|---|---|---|
| Runtime (hours, minutes) | 51 h, 38 m | 4 h, 12 m (91.9% reduction) |

As can be seen in Table 1, the deep learning model has 12× faster turn around time (TAT) than the rigorous three-dimensional model. For an area of 1 mm×1 mm with same number of cores (800), a TAT of 1.8 days (43 h 14 m) is achieved, whereas that large an area would typically require too long a TAT to be feasible using rigorous three-dimensional models. The TAT numbers shown in Table 1 are measured for the complete rigorous large scale lithography rule check flow (Proteus Litho Rule Check or PLRC in this example) including the PLRC runtime. Therefore, the pure simulation TAT (time required to simulate resist profiles) gain by using the deep learning approach is much higher.

The approach described above speeds up the simulation of three-dimensional photo resist contours by taking the 2DMM aerial images as an input, while computationally time-consuming effects are incorporated in the machine learning models. This allows simulating larger areas within a reasonable amount of time. Rigorous three-dimensional models typically are limited to areas of approximately 10 um×10 um and smaller without partitioning, whereas the approach described herein may feasibly be used for areas of 100 um×100 um, 1 mm×1 mm, or even larger. Even larger areas may also be partitioned into tiles, with each tile simulated to produce the corresponding tile of the three-dimensional resist profile. These tiles are then assembled to generate the three-dimensional resist profile over the full area. The simulation of different tiles may be performed in parallel.

In addition, since the training is done once for different dose/defocus conditions in a single model, that also reduces the training time significantly. In the example described above, the training dataset is created using a rigorous S-Litho model. Thus, the deep learning model learns different effects and captures them in the predicted outputs. This approach also has an advantage of reducing the memory usage during simulation. It addresses the memory problems faced during simulation of larger areas.

The computational lithography flow described above may be used for different applications. For example, it may be used to predict the resist profile. If the predicted resist profile does not match the desired profile, this may be used to correct various aspects of the lithography system: the source design, the design of the lithographic mask, etc. Once the lithographic mask and lithography system are designed, the computational lithography flow may be used to verify the correctness of the design.

Figure 5:
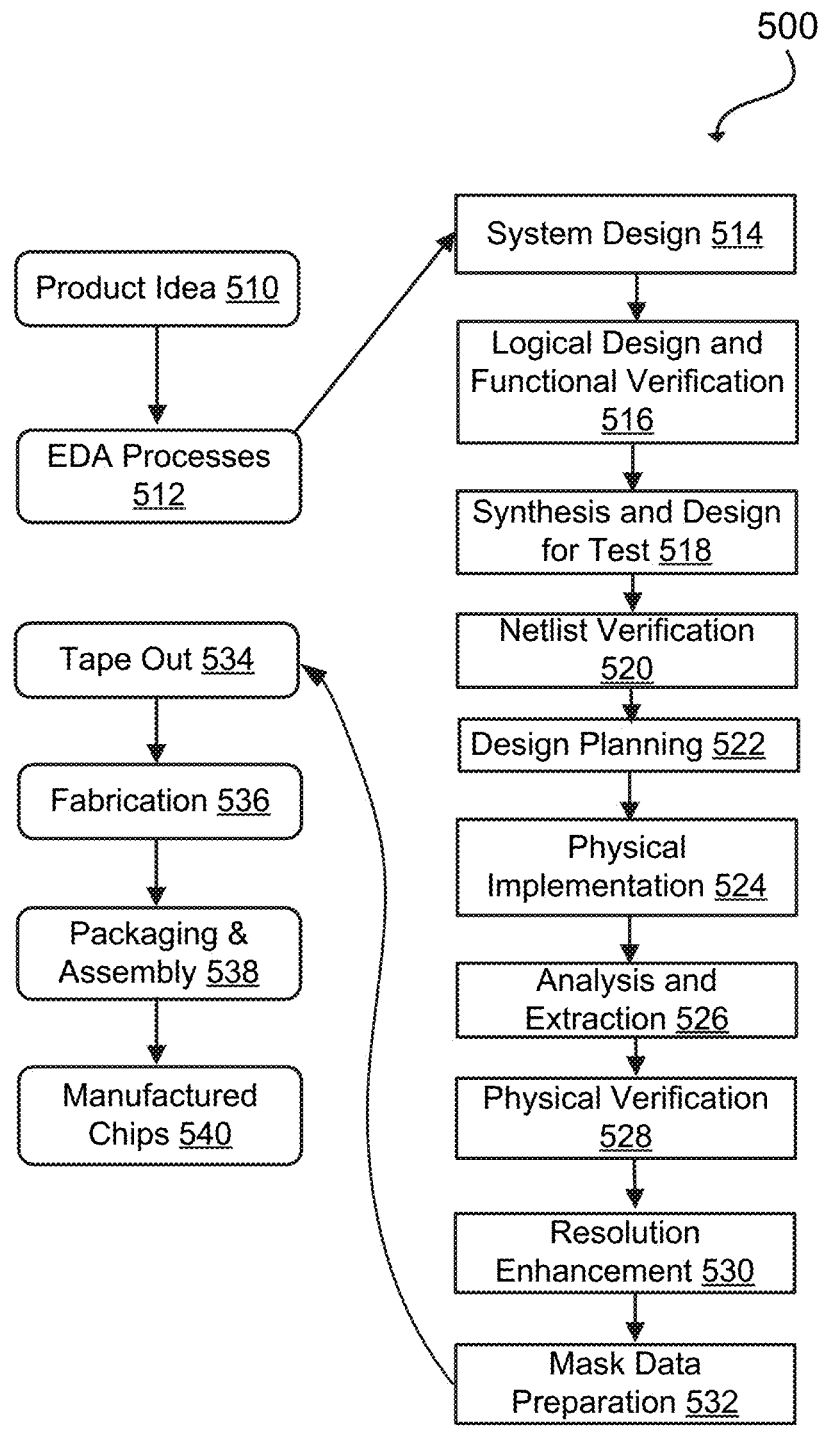
FIG. 5 depicts a flowchart of various processes used during the design and manufacture of an integrated circuit in accordance with some embodiments of the present disclosure.

FIG. 5 illustrates an example set of processes 500 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 510 with information supplied by a designer, information which is transformed to create an article of manufacture that uses a set of EDA processes 512. When the design is finalized, the design is taped-out 534, which is when artwork (e.g., geometric patterns) for the integrated circuit is sent to a fabrication facility to manufacture the mask set, which is then used to manufacture the integrated circuit. After tape-out, a semiconductor die is fabricated 536 and packaging and assembly processes 538 are performed to produce the finished integrated circuit 540.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 5. The processes described by be enabled by EDA products (or EDA systems).

During system design 514, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 516, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 518, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 520, the netlist is checked for compliance with timing constraints and for correspondence with the HDL code. During design planning 522, an overall floor plan for the integrated circuit is constructed and analyzed for timing and top-level routing.

During layout or physical implementation 524, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 526, the circuit function is verified at the layout level, which permits refinement of the layout design. During physical verification 528, the layout design is checked to ensure that manufacturing constraints are correct, such as DRC constraints, electrical constraints, lithographic constraints, and that circuitry function matches the HDL design specification. During resolution enhancement 530, the geometry of the layout is transformed to improve how the circuit design is manufactured.

During tape-out, data is created to be used (after lithographic enhancements are applied if appropriate) for production of lithography masks. During mask data preparation 532, the 'tape-out' data is used to produce lithography masks that are used to produce finished integrated circuits.

A storage subsystem of a computer system (such as computer system 600 of FIG. 6) may be used to store the programs and data structures that are used by some or all of the EDA products described herein, and products used for development of cells for the library and for physical and logical design that use the library.

Figure 6:
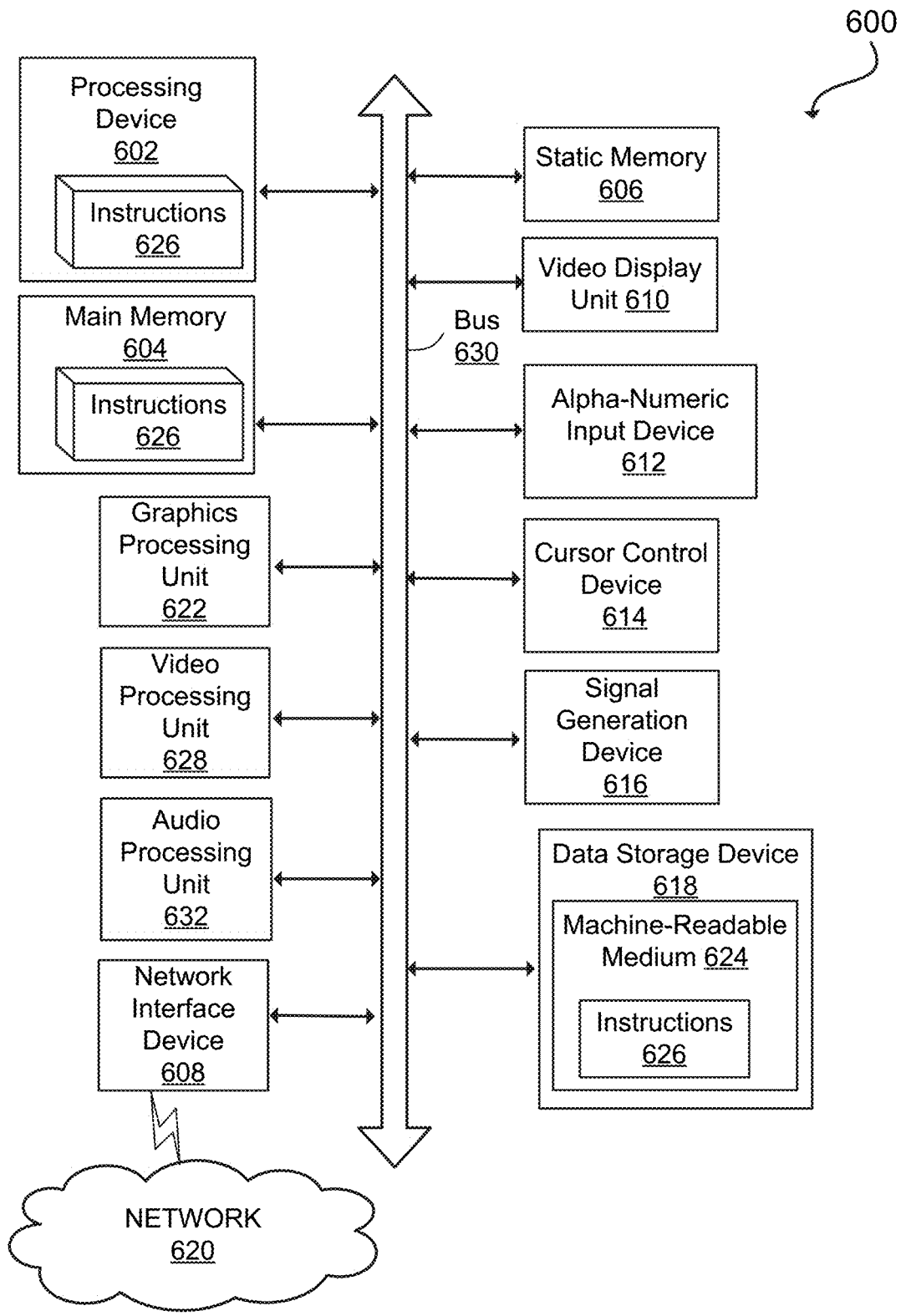
FIG. 6 depicts a diagram of an example computer system in which embodiments of the present disclosure may operate.

FIG. 6 illustrates an example machine of a computer system 600 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM), a static memory 606 (e.g., flash memory, static random access memory (SRAM), etc.), and a data storage device 618, which communicate with each other via a bus 630.

Processing device 602 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 may also be one or more special-purpose processing devices such as an application specific integrated circuit (ASIC), a field programmable gate array (FPGA), a digital signal processor (DSP), network processor, or the like. The processing device 602 may be configured to execute instructions 626 for performing the operations and steps described herein.

The computer system 600 may further include a network interface device 608 to communicate over the network 620. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), a graphics processing unit 622, a signal generation device 616 (e.g., a speaker), graphics processing unit 622, video processing unit 628, and audio processing unit 632.

The data storage device 618 may include a machine-readable storage medium 624 (also known as a non-transitory computer-readable medium) on which is stored one or more sets of instructions 626 or software embodying any one or more of the methodologies or functions described herein. The instructions 626 may also reside, completely or at least partially, within the main memory 604 and/or within the processing device 602 during execution thereof by the computer system 600, the main memory 604 and the processing device 602 also constituting machine-readable storage media.

In some implementations, the instructions 626 include instructions to implement functionality corresponding to the present disclosure. While the machine-readable storage medium 624 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 602 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
   receiving a first aerial image predicted by a two-dimensional model of a lithographic mask; and
   applying, by a first processor, a first machine learning model to infer a second aerial image from the first aerial image; wherein the first machine learning model receives the first aerial image as input and infers the second aerial image as output, the first machine learning model is trained using a training set that includes (a) samples of first aerial images and (b) ground truth of the corresponding second aerial images predicted by three-dimensional models of lithographic masks, and the three-dimensional models of the lithographic masks use three-dimensional descriptions of the lithographic masks.

2. The method of claim 1 further comprising:
   applying an exposure model to the second aerial image to generate an acid latent image; and
   applying, by a second processor, a second machine learning model to infer a resist profile from the acid latent image.

3. The method of claim 2 wherein each of the first aerial image, the second aerial image, the acid latent image and the resist profile is three-dimensional.

4. The method of claim 3 wherein each of the first aerial image, the second aerial image, the acid latent image and the resist profile comprises a set of two-dimensional slices at different heights, and each set has a same number of slices at a same height.

5. The method of claim 2 wherein the second aerial image is a normalized image that is independent of exposure dose, and applying the exposure model comprises applying an exposure dose to the normalized second aerial image.

6. The method of claim 2 wherein neither the first machine learning model nor the second machine learning model uses exposure dose as an input.

7. The method of claim 2 wherein the resist profile is represented by a signed distance value function, wherein a magnitude of the signed distance value function at a point is a distance from the point to the closest contour of the resist profile and a sign of the signed distance value function represents whether the point lies inside or outside the closest contour.

8. The method of claim 1 wherein the two-dimensional model of the lithographic mask models each point of the lithographic mask as affecting a phase and amplitude of light incident on the lithographic mask.

9. A system comprising:
   a memory storing instructions; and
   a processor, coupled with the memory and to execute the instructions, the instructions when executed cause the processor to:
   access a first training set comprising (a) samples of first aerial images predicted by two-dimensional models of lithographic masks; and (b) ground truth of corresponding second aerial images predicted by three-dimensional models of the lithographic masks, wherein the three-dimensional models of the lithographic masks use three-dimensional descriptions of the lithographic masks; and
   train a computational lithography model using the first training set, wherein the computational lithography model simulates a lithography process using the lithographic mask, the computational lithography model comprises a first machine learning model that infers second aerial images from the first aerial images, the first machine learning model receives the first aerial image as input and infers the second aerial image as output, and training the computational lithography model comprises training the first machine learning model based on a comparison of (x) the inferred second aerial images output by the first machine learning model, and (y) the ground truth of the second aerial images from the first training set.

10. The system of claim 9 wherein:
the computational lithography model further comprises an exposure model that generates acid latent images from the 3DMM aerial images, and a second machine learning model that infers resist profiles from the acid latent images; and
training the computational lithography model further comprises training the second machine learning model using a second training set, the second training set comprising (a) acid latent images; and (b) corresponding ground truth resist profiles.

11. The system of claim 10 wherein training at least one of the machine learning models uses a weighted cost function with weights that are a function of the outputs in the training set.

12. The system of claim 10 wherein the first and second training sets includes inputs and corresponding outputs generated using different exposure doses and different defocus conditions.

13. The system of claim 10 wherein the exposure model is parameterized and training the computational lithography model comprises adapting a parameter of the exposure model in conjunction with training one of the machine learning models.

14. The system of claim 9 wherein the ground truth 3DMM aerial images are calculated using a three-dimensional rigorous Maxwell's equations model of the lithographic masks.

15. A non-transitory computer readable medium comprising stored instructions, which when executed by a processor, cause the processor to:
receive a design of a lithographic mask;
divide the design of the lithographic mask into tiles;
for each tile, apply a computational lithography model that simulates a contribution of the tile to a lithography process using the lithographic mask; wherein the computational lithography model comprises:
a first machine learning model that infers a second aerial image from a first aerial image, the first aerial image predicted by a two-dimensional model of the tile; wherein the first machine learning model receives the first aerial image as input and infers the second aerial image as output, and the first machine learning model is trained using a training set that includes (a) samples of first aerial images and (b) ground truth of the corresponding second aerial images predicted by three-dimensional models of lithographic masks, and the three-dimensional models of the lithographic masks use three-dimensional descriptions of the lithographic mask;
an exposure model that generates an acid latent image from the second aerial image; and
a second machine learning model that infers a resist profile from the acid latent image;
assembling the resist profiles for the tiles; and
adjusting a design of the lithography process based on the assembled resist profiles.

16. The non-transitory computer readable medium of claim 15 wherein the first and second machine learning models comprise a double U-net structure.

17. The non-transitory computer readable medium of claim 15 wherein the tiles have an area that is at least 10×10 times larger than an area which can be modeled using a rigorous three-dimensional electromagnetic model of the tile.

18. The non-transitory computer readable medium of claim 15 wherein the tiles have areas of at least 100 um×100 um.

19. The non-transitory computer readable medium of claim 15 wherein the first and second machine learning models each comprise a supervised deep-learning model.

20. The non-transitory computer readable medium of claim 15 wherein adjusting a design of the lithography process comprises modifying the design of the lithographic mask based on the assembled resist profiles.

* * * * *